United States Patent [19]

House

[11] Patent Number: 4,796,232

[45] Date of Patent: Jan. 3, 1989

[54] DUAL PORT MEMORY CONTROLLER

[75] Inventor: Charles E. House, Redondo Beach, Calif.

[73] Assignee: Contel Corporation, Atlanta, Ga.

[21] Appl. No.: 111,428

[22] Filed: Oct. 20, 1987

[51] Int. Cl.[4] .............................................. G11C 13/00
[52] U.S. Cl. .................................... 365/189; 364/900;
365/219; 365/222; 365/230
[58] Field of Search .................. 365/49, 189, 190, 219, 365/210, 222, 230; 364/900

[56] References Cited

U.S. PATENT DOCUMENTS 4,683,555 7/1987 Pinkham ............................ 365/215

Primary Examiner—Terrell W. Fears
Attorney, Agent, or Firm—Roy A. Ekstrand

[57] ABSTRACT

A dual port memory controller is operative to interface a pair of processors to a common multiple bank organized memory. A dedicated logic array provides arbitration between conflicting processor requests for memory access. Refresh means are operative upon the memory banks in a staggered fashion to minimize noise created within the system during refresh and to permit simultaneous refresh of an access to the memory.

8 Claims, 7 Drawing Sheets

DUAL PORT MEMORY CONTROLLER

FIELD OF THE INVENTION

This invention relates generally to multiple processor computer systems and particularly to multiple processor computing systems in which a common memory is accessed by more than one processor.

BACKGROUND OF THE INVENTION

In the basic computer system, a central processing unit or processor is operative in accordance with a predetermined program or set of instructions stored within an associated memory. In addition to the stored instruction set or program under which the processor operates, memory space either within the processor memory or in an associated additional memory, is provided to facilitate the central processors manipulation of information during processing. In essence, the additional memory provides for the storage of information created by the processor as well as the storage of information on a temporary or "scratchpad" basis which the processor uses on an interim basis in order to carry out the program. In addition, the associated memory often provides locations in which the output information of the processor operating under the program set may be placed in order to be available for the system's output device. For example, once the processor has produced a predetermined table of information, it may be formatted and stored within the additional memory to facilitate its display on the system monitor or its transmission to a printer for hard copy output.

In the systems of the type described above in which a single processor is operative and utilizes one or more associated memories, the access of the processor to the different memories is relatively simple and straight forward. However, in more complex computer systems in which two processors or in which systems utilizing different processors are simultaneously in operation, access to memory becomes more complex. Since it is likely that each of the processors or processor systems may require access to the same memory simultaneously, a conflict between processors will generally be unavoidable. In essence, the operation of two processors or processor systems periodically results in overlap of the processors with respect to a common memory. Such overlap may, in some systems, be eliminated by complete redundancy of the memories used for each of the processors and isolation of the two processor systems. However, this often defeats the intended advantage of the multiple processor system. Such multiple processor systems are most efficient if operative to simultaneously carry forward multiple computing operations upon the same data in which one processor supports the operation of the other. Such dual processor systems may be either time shared in which the processors compete for access to a common bus or dual ported in which each processor has its own memory bus and one is queued while the other is given access.

A similar problem of conflicting memory access demands often arises in systems in which a plurality of users require access to a common data base. These systems are often referred to as "multiuser" systems. Because the data base sought to be used is nothing more than a common memory, the overlap of processor use created by simultaneous attempts of two or more processors to access the same data base is again likely to occur.

With the onset of the memory foregoing types of access problem, practitioners in the art have sought, by system architecture, to either avoid conflicts entirely (conflict avoidance) or to set up various systems which sense the existence of conflicts between processors and resolve them in accordance with some predetermined set of system rules (priority system). The avoidance of conflict is a very basic system approach in which the processors are sequentially operated or operated on a time sharing base. In essence, the processors simply "take turns". One of the most common sequential conflict avoidance systems is that known as "passing the ring" or "token system" in which the potentially conflicting processors are simply polled by the system in accordance with a predetermined sequence similar to passing a ring about a group of users.

While conflict avoidance, through the use of sequenced processor access, provides a solution to conflicting processor access demands upon a common memory, its use imposes a significant limitation upon the operation of the overall computing system. This limitation arises from the fact that a substantial time is used by the system in polling the competing processors in accordance with the sequence. In the event a single processor is operating and requires access to the common memory, a delay between processor accesses to the memory is created following each memory cycle as the system steps through the sequence.

As a result of the shortcomings and system limitations associated with the conflict avoidance approach using sequential processor access, practitioners in the art have created various priority systems in which the conflicts of competing processors are resolved on the basis of some preestablished priority. In the simplest such system, each processor is assigned a priority within the hierarchy of system importance and the memory controller simply provides access to the highest priority processor each time a conflict occurs. All lower priority processors simply wait for access to the memory. For example, in a typical two processor system, a first and a second processor are operative and access a common memory. In addition, the type of the memory most often used is known as a dynamic RAM or DRAM which requires periodic refreshing of the memory to maintain the stored data. Generally, the memory is refreshed by a separate independent refresh system which includes means for timing the refresh interval. In such a system, both processors and the refresh system compete for access to the common memory. While each system is different, the likely priority to be assigned will place the refresh system at the highest priority and then based upon system architecture, a higher priority is assigned to one of the processors over the other. For example, the system may determine that the highest priority will be given to the first processor and a lower priority given to the second processor. As a result, the system will function normally in the absence of conflict. Each time a request to access the common memory is received by the memory controller. It will grant the request and the processor will access the memory. If however, simultaneous requests are received by the controller, a conflict arises and the controller will grant access first to the refresh system. If no refresh request exists, it will grant access to the first processor. After the refresh and/or the first processor are finished and if neither makes another request, access to the second processor is granted. While such systems resolve the conflict of simultaneous requests and provide a more efficient operation than a purely sequential conflict avoidance system, straight priority systems suffer from a lack of flexibility. As a result, they cannot meet varying circumstances in which the priorities of the competing memory access must be changed to meet a given situation. For example, it may be that one processor is the dominant and "most important" processor in the system in most computing operations. However, there invariably arise circumstances in which it is nonetheless desirable to grant a higher priority to the second processor in order to smooth out overall system speed and performance. As a result, the straight priority system is a relatively fast system, in the sense that no time is allocated to a decision making process and therefore a request may be granted by the controller relatively quickly. However, overall system speed may be lost as a processor with a lower assigned priority waits for access to complete an essential function.

This need for flexibility in the priority assignment, has prompted practitioners in the art to create systems with actual decision making capability incorporated within the system of the memory controller. While a number of such decision making memory controllers have been produced and they vary somewhat in specific operation, generally all provide a sequential decision making process which is carried forward each time simultaneous requests are made. Unfortunately, because the decision making portions of the memory controller are operated under the control and timing of a clock system, a problem arises in that considerable time may be utilized in going through the deicsion process before the memory controller can grant access to a particular processor. While a simple solution would involve increasing the speed of the clock under which the memory controller is operating, there arises a general limitation on the practical speed of such clock circuits within economically feasible production devices. As a result, as system designers create faster and faster central processing units, a basic dilemma arises in designing memory controllers. On the one hand, there is a need for increased decision making capability or intelligence. On the other hand, there is a need for increased speed of operation in granting memory access. Unfortunately, it appears that at present, each of these needs tends to exclude the other. In other words, at some point, increased memory controller intelligence or decision making capability is achieved at a reduction of overall speed of request processing and conversely system design characteristics targeted at increasing the speed of request processing by the memory controller are achieved at a sacrifice of the intelligence or decision making flesibility of the memory controller.

There arises therefore a need in the art for a memory controller capable of controlling the access to a common memory between two competing processor or processor systems in which the memory controller operates with sufficient speed to grant the processor access requests while maintaining sufficient system flexibility to maintain the overall speed of the multiple processor computing system.

SUMMARY OF THE INVENTION

Accordingly, it is a general object of the present invention to provide an improved memory controller for use in a computing system having two processors. It is a more particular object of the present invention to provide an improved memory controller which provides sufficient flexibility to maintain overall computing system speed at an appropriate level while minimizing the delay time for each of the individual processors in accessing the common memory.

In accordance with the invention there is provided a dual port memory controller which includes a dedicated logic array coupled to an arbitrator system. A multi bank dynamic memory is refreshed in a staggered sequence to minimize noise created within the system.

BRIEF DESCRIPTION OF THE DRAWINGS

The features of the present invention, which are believed to be novel, are set forth with particularity in the appended claims. The invention, together with further objects and advantages thereof, may best be understood by reference to the following description taken in conjunction with the accompanying drawings, in the several figures of which like reference numerals identify like elements and in which:

DESCRIPTION OF THE PREFERRED EMBODIMENT

Figure 1:
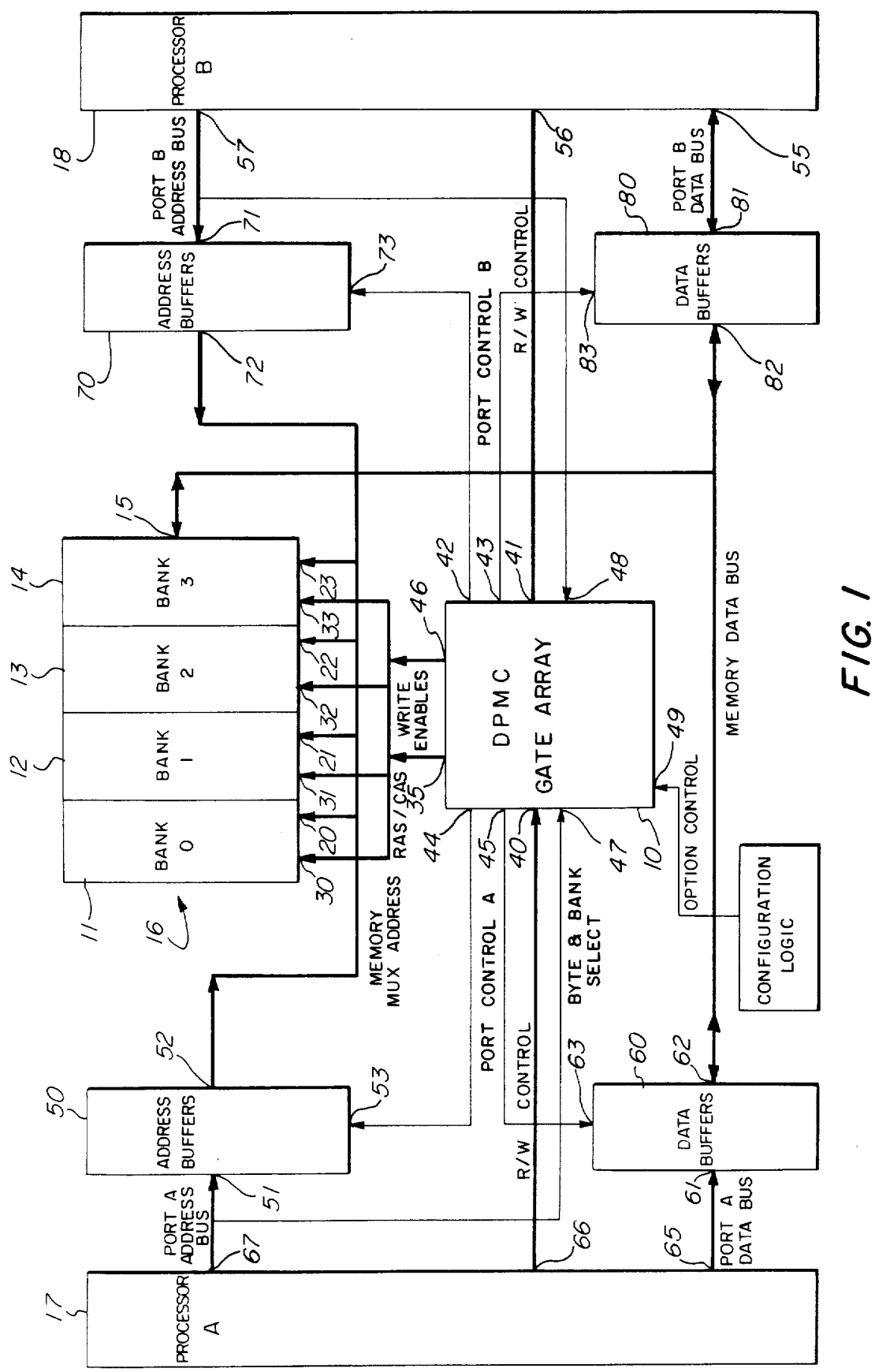
FIG. 1 is a block diagram of the system environment of the present invention dual port memory controller.

FIG. 1 sets forth a block diagram of the present invention dual port memory system in which a dual port memory gate array 10 includes a pair of read/write control inputs 40 and 41, a pair of data control outputs 45 and 43, a pair of address control outputs 44 and 42, a set of Row Address Strobe and Column Address Strobe outputs 35 (RAS/CAS), a set of write enable outputs 46, a pair of byte and bank select inputs 47 and 48 and an option control input 49. A memory array 16 includes a quartet of individual memory banks 11, 12, 13 and 14 all of which are commonly coupled to a memory data bus terminal 15. Memory 16 is constructed in accordance with conventional dynamic RAM memories, generally referred to as DRAM, in which a plurality of individual memory banks are combined and couple to a common memory data input/output terminal (in this case, terminal 15). Memory bank 11 includes a RAS/CAS write enable input terminal 30 and a multiplexed address input 20. Similarly, memory banks 12, 13 and 14 include RAS/CAS write enable inputs 31, 32 and 33 respectively and multiplex address inputs 21, 22 and 23 respectively. A port A address buffer 50 buffers and multiplexes the Row and Column address to the DRAM and includes a port A address bus input 51, a multiplex address output 52 and a address control signal input 53. Port A address bus input 51 is coupled to the address bus output of processor A. Multiplex address bus output 52 is coupled to inputs 20, 21, 22 and 23 of memory banks 11, 12, 13 and 14 respectively. Port B address buffer 70, similar to address buffer 50 which also buffers and multiplexes the Row and Column address to the DRAM, includes an input address bus 71 and multiplexed output address bus 72 and an address control signal input 73. Bus 71 is coupled to the address bus output of processor B and multiplexed address bus output 72 is coupled to inputs 20 through 23 of memory banks 11 through 14 respectively. Control signal input 73 is coupled to output 42 of gate array 10. Similarly, control input 53 of address buffer 50 is coupled to output 44 of gate array 10. A data buffer 60, constructed in accordance with conventional data buffer fabrication techniques, includes a data bus input 61, a memory data bus output 62 and a control signal input 63. Similarly, a data buffer 80, also of conventional data buffer fabrication, includes a data bus input 81, a memory data bus output 82 and a control signal input 83.

A processor 17, also preferred to as processor A, includes an address bus output 67 coupled to input 51 of address buffer 50, a read/write control signal output 66 coupled to read/write control input 40 of gate array 10, and a bidirectional data bus 65 coupled to input 61 of data buffer 60. Similarly, a processor 18, referred to herein as processor B, includes an address bus output 57 coupled to input 71 of address buffer 70, a read/write control output 56 coupled to input 41 of gate array 10, and a bidirectional data bus 55 coupled to input 81 of data buffer 80.

The details and operation of dual port memory control gate array 10 are set forth below in greater detail. However, suffice it to note here that in accordance with the present invention, gate array 10 is formed of a plurality of logic gates arranged in a predetermined array and is fabricated in a manner whereby a plurality of individual gates are configured to produce a complex digital logic system which carries forward the functional activities set forth below in greater detail. The basic function of gate array 10 within the system shown in FIG. 1, is to control the transfer of information to and from memory 16. Accordingly, gate array 10 includes a pair of control signal lines coupled to address buffer 50 and data buffer 60 as well as a second pair of control signal lines coupled to address buffer 70 and data buffer 80. In its normal operation, processor A, which may comprise any number of individual central processing units but in its preferred form comprises either an Intel 80386 or 80286 processor, is coupled to address buffer 50 and data buffer 60 such and that all address and data information outputted by and received by processor A from memory array 16 is coupled through buffers 50 and 60. In accordance with conventional digital circuit operation, processor A accesses memory 16 by outputting a request which is applied to gate array 10 at terminal 40. In addition, an appropriate address is placed on processor A address bus and is applied to address buffer 50 and data is either applied or received through data buffer 60 depending on the nature of the operations. The nature of the signal applied by processor A to gate array 10 at terminal 40 is dependent upon whether processor A desires to store information within memory 16 (write) or retrieve information from a specified location within memory 16 (read). In the event processor A is retrieving information, that is to say executing a read from memory 16, a read control signal is applied to terminal 40 of gate array 10 which creates a request by processor A to access memory 16. Concurrently, the address of the information sought to be read by processor A is stored within address buffer 50 and data buffer 60 is configured to receive the incoming information anticipated once the read of memory 16 at the desired location is accomplished. At this point however, no communication between processor A and memory 16 takes place until gate array 10 provides the appropriate output signals, both to memory 16 and buffers 50 and 60 to facilitate the read. In the event gate array 10, for reasons set forth below in greater detail, determines that processor A may access memory 16, the appropriate control signals are produced at output temrinals 44 and 45 of gate array 10 and are applied to buffers 50 and 60. The application of control signals to buffer 50 causes the address information in buffer 50 to be outputted to the multiplex address terminals 20 through 23 of memory 16. Certain bits of processor A's address bus 67 are applied to input 47 of gate array 10 to determine which bank the requested operation will be performed in. Concurrently, gate array 10 produces the appropriate RAS/CAS signal outputs to the appropriate memory bank to properly configure memory 16 to address the stored information sought by processor A in accordance with the memory address provided by buffer 50. The application of control signals to buffer 60 causes the data from the memory data bus to be allowed to pass through the data buffer 60 to the Port A data bus terminal 65.

It should be noted that each of banks 11, 12, 13 and 14 within memory 16 are organized in a conventional multiplex configuration in which each address within the memory bank is uniquely defined by a row address and a column address. In addition, the particular bank from among banks 11 through 14 is uniquely identified by the appropriate RAS/CAS signals. Accordingly, the output from address buffer 50 comprises an appropriate row and column designation which combined with the RAS/CAS signals for that bank, uniquely identify the portion of memory 16 to e accessed. By means set forth below in greater detail, the RAS/CAS signal causes the appropriate location within memory 16 to be read out on memory data bus terminal 15 which in turn is coupled by the memory data bus to input terminal 62 of data buffer 60. The retrieved information is passed through data buffer 60 and thereafter the coupling between memory 16, data buffer 60 and address buffer 50 is terminated and a memory cycle is complete. In accordance with the invention, buffer 60 needs no storage because processor A's internal clock is synchronous with that of the gate array. Buffer 80 has storage for data going from memory to processor B because their clocks are not synchronous. Therefore, gate array 10 "leaves" the data in buffer 80 and disconnects from it. Processor B is then free to retrieve the data when it is ready.

The process by which processor B reads information from memory 16 is substantially identical to that general process description set forth for processor A in that a request by processor B is applied to terminal 41 of gate array 10 and an appropriate address is applied to address buffer 70 while data is received through data buffer 80. Thereafter, in the event gate array 10 determines that the request of processor B may be granted, a pair of control signals are outputted at terminals 42 and 43 which couple the address information from address buffer 70 to memory 16 and which couple data buffer 80 to the memory bus terminal 15.

A similar operation takes place in the event of a processor request for a write operation, that is, a request by the processor to store data within a specified memory location. In such case, a write control is coupled to terminal 40 of gate array 10 by processor A and an address is coupled to address buffer 50 while the desired data to be stored is applied to data buffer 60. Once again, gate array 10 determines whether the request is to be granted and upon granting the access to processor A, the port A address bus is coupled from address buffer 50 to the multiplex address bus of memory 16 and certain address bits are applied to input 47 of gate array 10 while the appropriate RAS/CAS signal is outputted at terminal 35 of gate array 10 which configures the appropriate bank of memory 16 and defines the location within memory 16 into which information is to be written. Concurrently, data buffer 60 coupled the port A data bus to output terminal 62 thereof and through the memory data bus to the memory data bus terminal 15 of memory 16. The write enable signals 46 of gate array 10 are then activated and presented to the appropriate bank. Once the CAS signal has strobed the information into the appropriate address of memory 16, the write operation is complete and gate array 10 may accept another request for access to the memory.

The operation of processor B in the write function is essentially the same in that a write control signal is applied to input terminal 41 of gate array 10 while an address signal is coupled to address buffer 70 and the to-be-written data is applied to data buffer 80. Once again, if gate array 10 determines that the access is to be granted, the appropriate control signals are applied to terminal 73 and 83 of buffers 70 and 80. Simultaneously, the appropriate RAS/CAS signal is coupled to memory 16 and the information is transferred from data buffer 80 to input terminal 15 of memory 16 and strobed to the appropriate location by the CAS signal. Thereupon, the operation is complete and gate array 10 may once again accept a request from another processor.

The situation discussed so far described the circumstance in which either processor B or processor A attempt to access memory 16 at different times. In actual operation however, the system shown in FIG. 1 results in three systems attampting to access memory 16. These three systems are processor A, processor B and the internal refresh system which, as mentioned above, is operative to periodically refresh the dynamic memory within memory 16. In accordance with an important aspect of the present invention and as is described below in greater detail, the refresh function of gate array 10 is operative upon banks 11 through 14 of memory 16 independently. In further accordance with an important aspect of the present invention, the individual refreshing of banks 11 through 14 of memory 16 is carried forward in a staggered timing pattern such that at any given time during refresh, a single one of banks 11 through 14 is occupied by the refresh system leaving the remaining three banks operational. As a result, gate array 10 may process a request by processor A or B to any of the three unoccupied banks within memory 16 notwithstanding the ongoing function of memory refresh taking place. As will be apparent, this provides considerable advantage over systems utilizing a refresh operation which is not staggered. The basic function of gate array 10 is to resolve the conflict which results from simultaneously requests to access memory 16 from the three possible sources of processor A, processor B and the refresh system. By means set forth below in greater detail and in accordance with an important aspect of the present invention, gate array 10 includes a logic system which does not require the multiple cycle times of the clock signals of processors A and B. In contrast to other systems in which decisions are made during the occurence of clock cycles and as is described below in greater detail, gate array 10 determines the priority of access in accordance with certain built-in decision rules that are embodied in the logic array. This set of logic rules are demonstrated below in the accompanying flow diagrams. However, suffice it to note here that gate array 10 functions essentially to grant the highest priority to a refresh request followed by resolution of conflicting requests between processors A and B in accordance with decisions which turn on whether the last access was given to the requesting processor as well as the question of whether the processor was denied request during the foregoing conflict of access.

Figure 2:
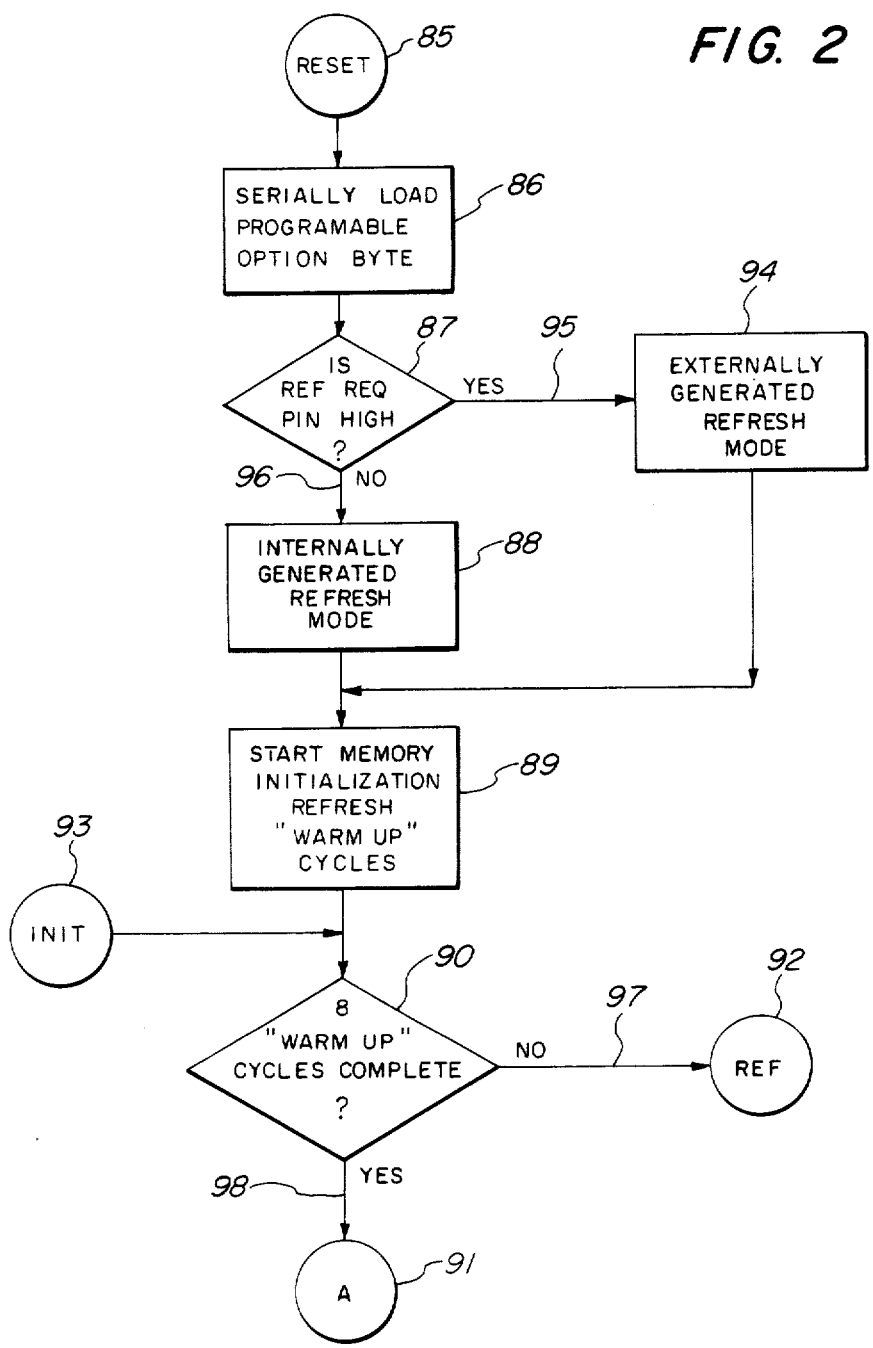
FIG. 2 is a flow diagram of the initialization operation of the present invention dual port memory controller.

FIG. 2 sets forth the flow diagram for the internal logic of the present invention dual port memory controller during the initialization function. In accordance with an important aspect of the present invention, the dual port memory controller utilizes a logic array rather than a serial program to make system decisions. Correspondingly, the flow diagrams in FIGS. 2 through 6 depict this decision process rather than a serial program. The initialization function is initiated each time the system is "powered up", that is, at the start of each use of the system within which the dual port memory controller is operating. Accordingly, a reset function 85 responds to the existence of a power up and initiates the reset function which is followed by an operaiton at block 86 in which the programmable option byte is serially loaded. In essence, this operation configures the dual port memory controller gate array (seen in FIG. 1) for the different operations relating to the particular processors used for processors A and B (seen in FIG. 1). In essence, function 86 describes the operative environment to the dual port memory controller. Thereafter, the operation moves to a decision function 87 in which a determination is made as to whether a external refresh request is present. As mentioned, the refresh system runs independently in response to its own timing clocks in order to assure that the memory is periodically refreshed in accordance with the requirements of a dynamic RAM. In the event an external refresh request is present, the system branches to branch 95 and function 94 in which an externally generated refresh mode is initiated. This function operates to inform the refresh timer circuit that acceptance should be given to external refresh signals. Once the function of block 94 is complete, the system returns to function block 89. In the event a refresh request is not present, the system continues through branch 96 to function 88 in which an internally generated refresh mode is undertaken. This operation tells the refresh timer circuit to generate internal refresh signals rather than look for external refresh signals. Thereafter, the system moves to function 89. In function 89, the memory initialization, refresh warm-up cycles are initiated. In essence, this function provides a predetermined number of refresh cycles to the dynamic RAM which are required to assure that the dynamic RAM is initialized. At the completion of the memory initialization in function 89, the system moves to a decision block 90 in which a determination is made as to whether the predetermined number of warm-up cycles have been completed. While the number of warm-up cycles necessary is to some extent a matter of designers choice, it has been determined for the present invention system that sixteen warm-up cycles of refresh are desired. Therefore, in the event a determination is made in decision block 90 that sixteen refresh cycles have been conducted, the system continues at branch 98 and enters the port A request line seen in FIG. 3. In the event that the eight warm-up refresh cycles have not been completed, the system transfers through branch 97 to the refresh system initiation in block 92 which is also seen in FIG. 6.

With the initialization set forth in FIG. 2 complete, the system enters the port A access system 91. In accordance with the priority rules under which the present invention dual port memory controller functions, gate array 10 automatically selects port A in the absence of any conflicting instruction. From input 91, the system moves to port A idle function 100 and decision block 101 in which a determination is made as to whether any requests are present in the system. In the event no request is present, the system branches at branch 107 and reports to port A idle function 100. This looping operation continues until a request is present, at which time the system continues at branch 108 to decision function 102 in which a determination is made as to whether the request is a refresh request. In the event the request is a refresh request, the system branches at branch 109 to a decision function 117 in which a determination is made as to whether there are any other requests present in the system. In the event no other requests are simultaneously requested, the system branches at branch 119 to refresh input 92 (seen in FIG. 6). In the event other requests are present in the system, the system branches at branch 120 to decision function 118 in which a determination is made as to whether the other request within the system is directed to the same bank as refresh is requested for. In the event that the request is directed to the same bank as refresh, the system branches at branch 121 and returns to refresh initiation 92. In the event the request is for a different bank than refresh, the system branches at branch 122 and the refresh operation 92 is simultaneously performed while the main system flow returns to branch 110.

In the event a determination is made in decision function 102 that the request within the system determined in function 101 is not a refresh request, the system continues at branch 110 to a decision function 103 in which a determination is made as to whether any requests have been queued. In the event a queued request exists, the system branches at branch 111 to a decision function at branch 123 in which the determination is made as to whether the queued request is a port A request. In the event it is, the system returns via branch 126 to branch 114. In the event the queued request is not a port A request, the system branches via branch 125 to the select B function 124 (seen in FIG. 4). In the event no queued requests are determined in function 103, the system continues via branch 112 to a decision function 104 in which a determination is made as to whether a port A request is present. In the event no port A request is determined, the system branches at branch 113 and returns to B select function 124. If the request is a port A request, the system continues via branch 114 to a decision function 105. In decision function 105, a determination is made as to whether a port B request is present. In the event a port B request has been made, the system branches at branch 115 to a function block 127 in which the port B request is queued. In the event a port B request is not present, the system continues to the memory cycle function input at 106 (seen in FIG. 5).

Figure 3:
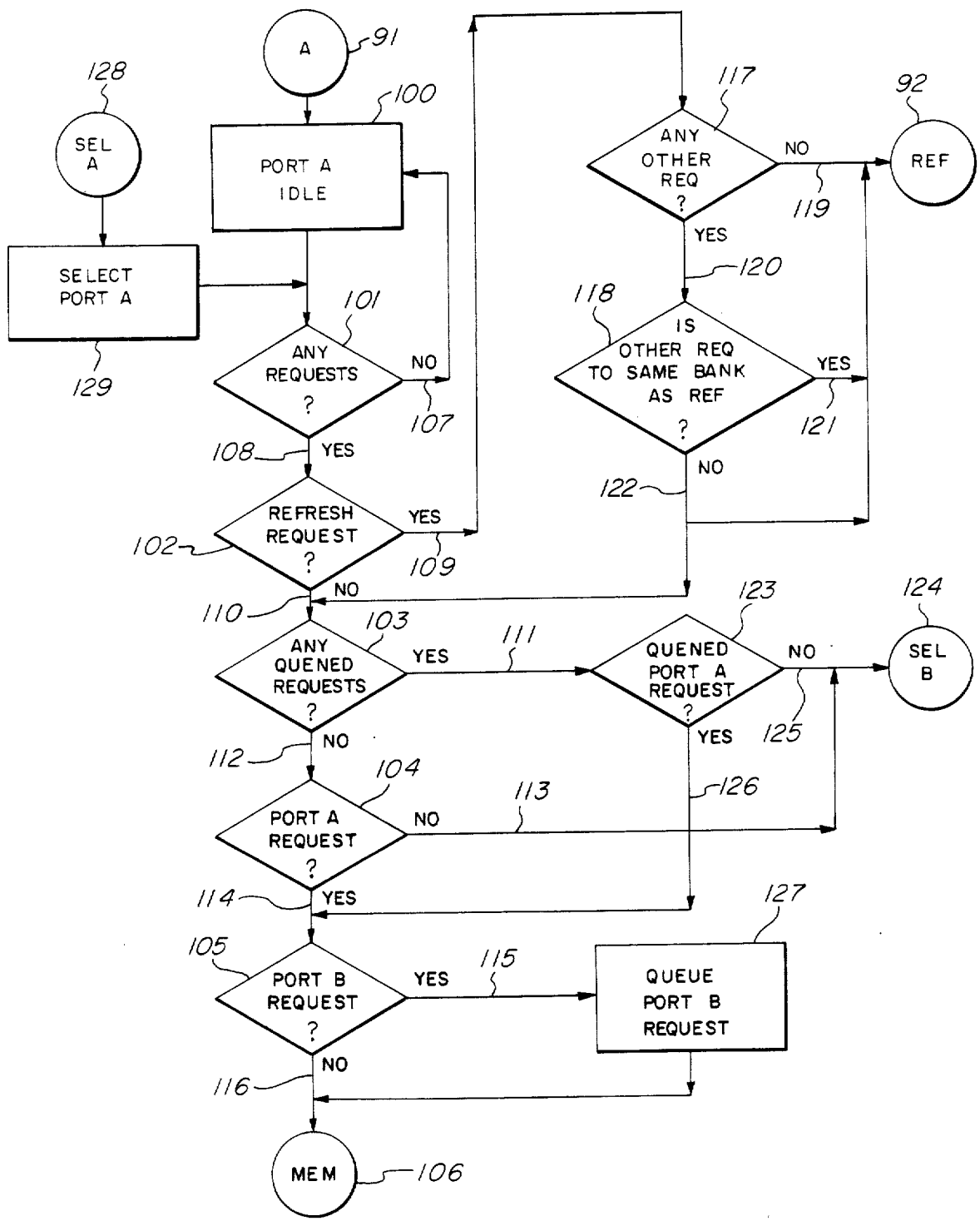
FIG. 3 is a flow diagram of the port A access of the present invention dual port memory controller.
Figure 4:
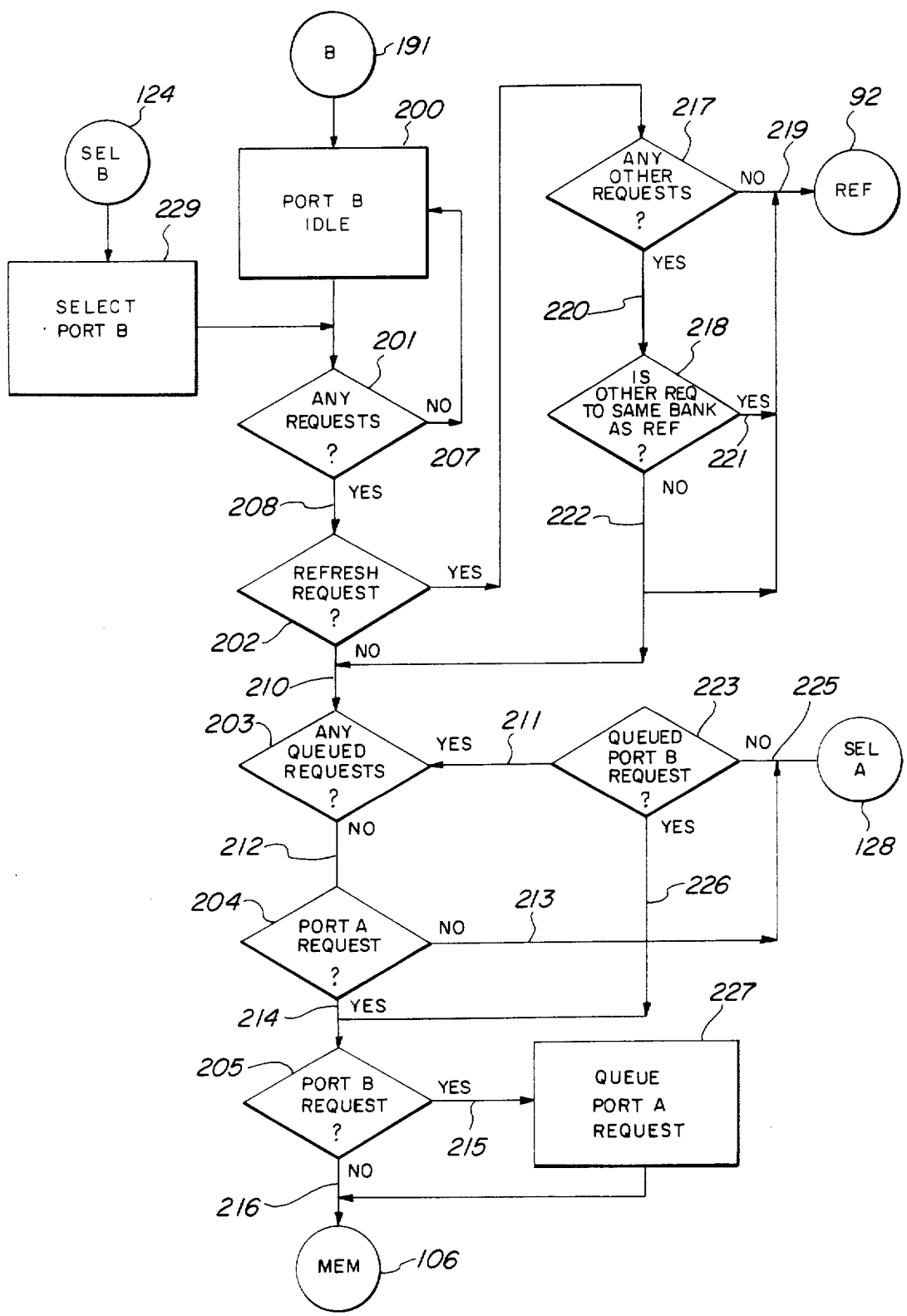
FIG. 4 is a flow diagram of the port B access of the present invention dual port memory controller.

It should be apparent from comparison of FIGS. 3 and 4 that the operation of the port B arbitration is identical to the operation of the port A arbitration shown in FIG. 3. Accordingly, from input 191, the system moves to port B idle function 200 and decision block 201 in which a determination is made as to whether any requests are present in the system. In the event no request is present, the system branches at branch 207 and reports to port B idle function 200. This looping operation continues until a request is present, at which time the system continues at branch 208 to decision function 202 in which a determination is made as to whether the request is a refresh request. In the event the request is a refresh request, the system branches at branch 209 to a decision function 217 in which a determination is made as to whether there are any other requests present in the system. In the event no other requests are simultaneously requested, the system branches at branch 219 to refresh input 92 (seen in FIG. 6). In the event other requests are present in the system, the system branches at branch 220 to decision function 218 in which a determination is made as to whether the other request within the system is directed to the same bank as refresh is requested for. In the event that the request is directed to the same bank as refresh, the system branches at branch 221 and returns to refresh initiation 92. In the event the request is for a different bank than refresh, the system branches at branch 222 and the refresh operaiton 92 is simultaneously performed while the main system flow returns to branch 210.

In the event a determination is made in decision function 202 that the other request within the system determined in function 201 is not a refresh request, the system continues at branch 210 to a decision function 203 in which a determination is made as to whether any requests have been queued. In the event a queued request exists, the system branches at branch 211 to a decision function at branch 223 in which the determination is made as to whether the queued request is a port B request. In the event it is, the system returns via branch 226 to branch 214. In the event the queued request is not a port B request, the system branches via branch 225 to the select A function 128 (seen in FIG. 3). In the event no queued requests are determined in function 203, the system continues via branch 212 to a decision function 204 in which a determination is made as to whether a port B request is present. In the event no port B request is determined, the system branches at branch 213 and returns to B select function 128. If the request is a port B request, the system continues via branch 214 to a decision function 205. In decision function 205, a determination is made as to whether a port A request is present. In the event a port A request has been made, the system branches at branch 215 to a function block 227 in which the port A request is queued. In the event a port A request is not present, the system continues to the memory cycle function input at 106 (seen in FIG. 5).

Figure 5:
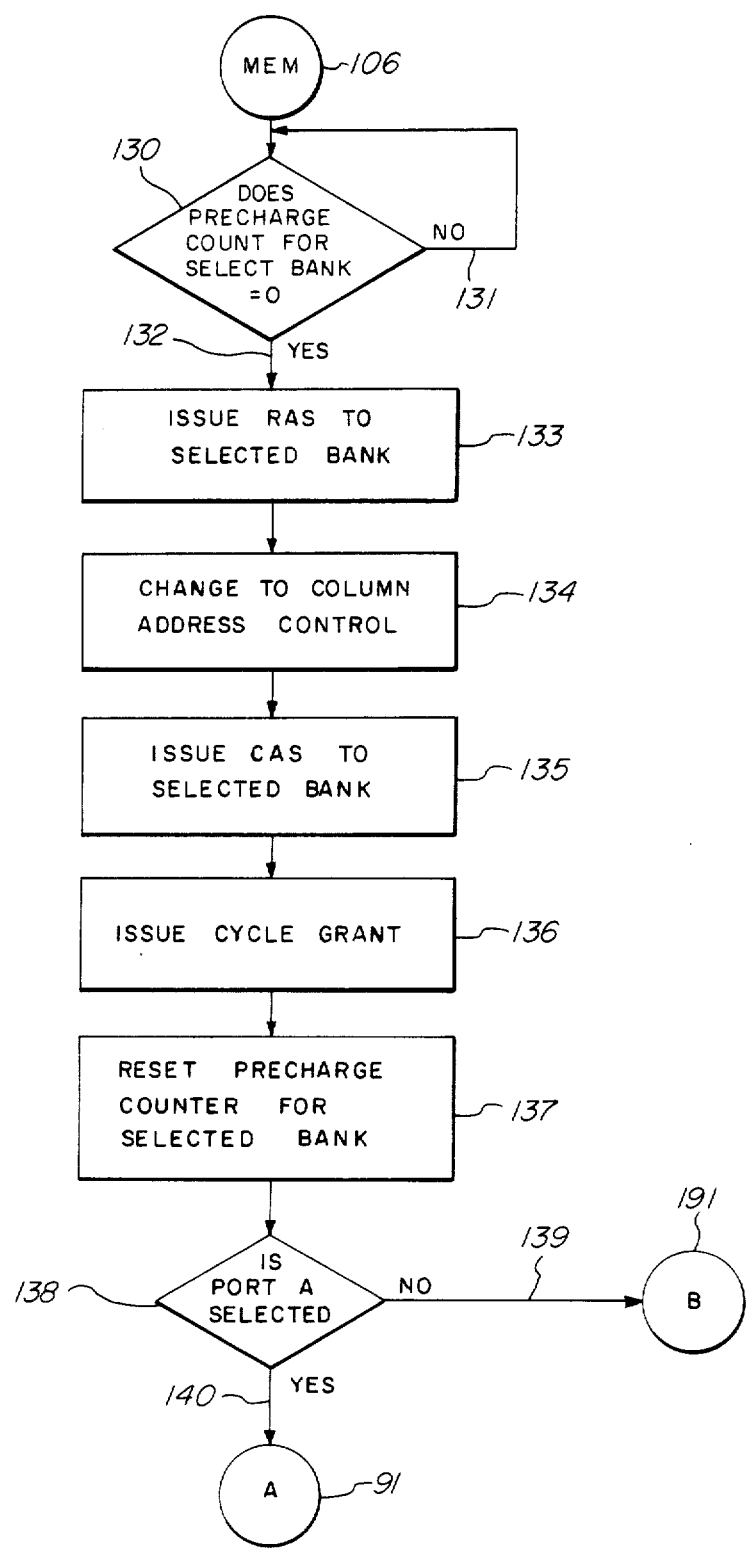
FIG. 5 is a flow diagram of a memory cycle of the present invention dual port memory controller.
Figure 6:
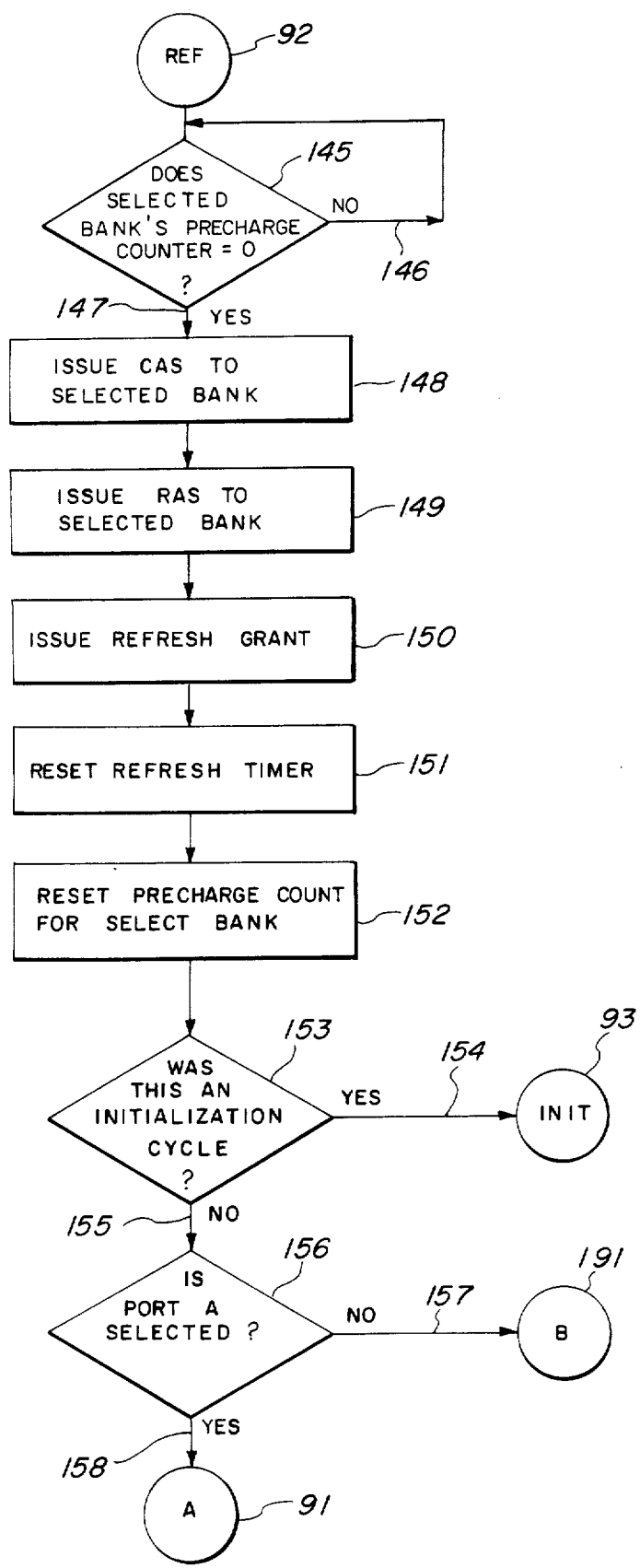
FIG. 6 is a flow diagram of a refresh cycle of the present invention dual port memory controller.

FIG. 5 sets forth the flow diagram for a memory cycle of the present invention dual port memory controller initiated at a memory input 106. Thereafter, the system moves to a decision function 130 in which a determination is made as to whether the appropriate precharge interval has passed. The precharge interval is a requirement of the DRAM in memory 16 and is described in more detail in the discussion of FIG. 7. In the event the precharge interval has not passed, the system returns by branch 131 to decision function 130. In the event the precharge interval has passed the system branches by branch 132 to a function 133 in which the RAS signal is issued to the selected bank. Thereafter, the system carries forward to function 134 in which the appropriate address control signals are changed from row address to column address control. Next, a function 135 is carried forward in which the CAS signal is issued to the selected bank. Upon completion of step 135, a function 136 is carried forward in which the cycle grant signal is issued which signals the completion of the cycle and enables the arbitrator to prepare for another request. The system next moves to a function 137 in which the precharge counter for the selected bank is reset which initiates the countdown to determine when a new RAS signal may be issued to that particular bank. The system next moves to a decision function 138 in which a determination is made as to whether port A is selected. In the event port A is selected, the system moves by a branch 140 to port A initiation 91. In the event port A is not selected, the system moves to port B initiation 191 by a branch 139.

FIG. 6 sets forth the flow diagram of a refresh cycle of the present invention dual port memory controller in which a refresh initiation 92 begins the refresh cycle. The system next moves to a decision function 145 in which a determination is made as to whether the selected bank of the memory has completed its precharge interval. In the event the precharge interval has not passed, the system branches at branch 146 and returns to decision function 145. In the event the precharge interval has passed, the system continues at branch 147 to function 148 in which the CAS signal is issued to the selected bank. It should be noted that the present invention system generates a CAS before RAS during refresh cycles because the gate array does not generate memory address during any cycle, whether refresh or processor cycle. Normal RAS only refreshes require that the row address be presented to the DRAM. Upon the issue of the CAS signal at function 148, the system moves to function 149 in which the RAS signal is applied to the selected memory bank. Next, the system moves to a function 150 in which the refresh grant is issued to the arbitrator. Thereafter, the system moves to a function 151 in which the refresh timer is reset. Next, the system moves to a function 152 in which the precharge count for the selected bank counter is reset to implement the precharge interval determination. Thereafter, the system moves to a decision function 153 in which a determination is made as to whether the preceding refresh cycle was an initialization cycle. In the event the previous refresh cycle was part of the initialization cycle set forth in FIG. 2, the system branches at branch 154 to initiation branch 93. In the event the foregoing refresh cycle was not part of an initialization cycle, the system continues at branch 155 to a decision function 156 in which a determination is made as to whether port A has been selected. In the event port A has not been selected, the system branches at branch 157 to port B arbitration 191 (seen in FIG. 4). In the event port A is selected, the system moves to branch 158 and to port A arbitration input 91.

Figure 7:
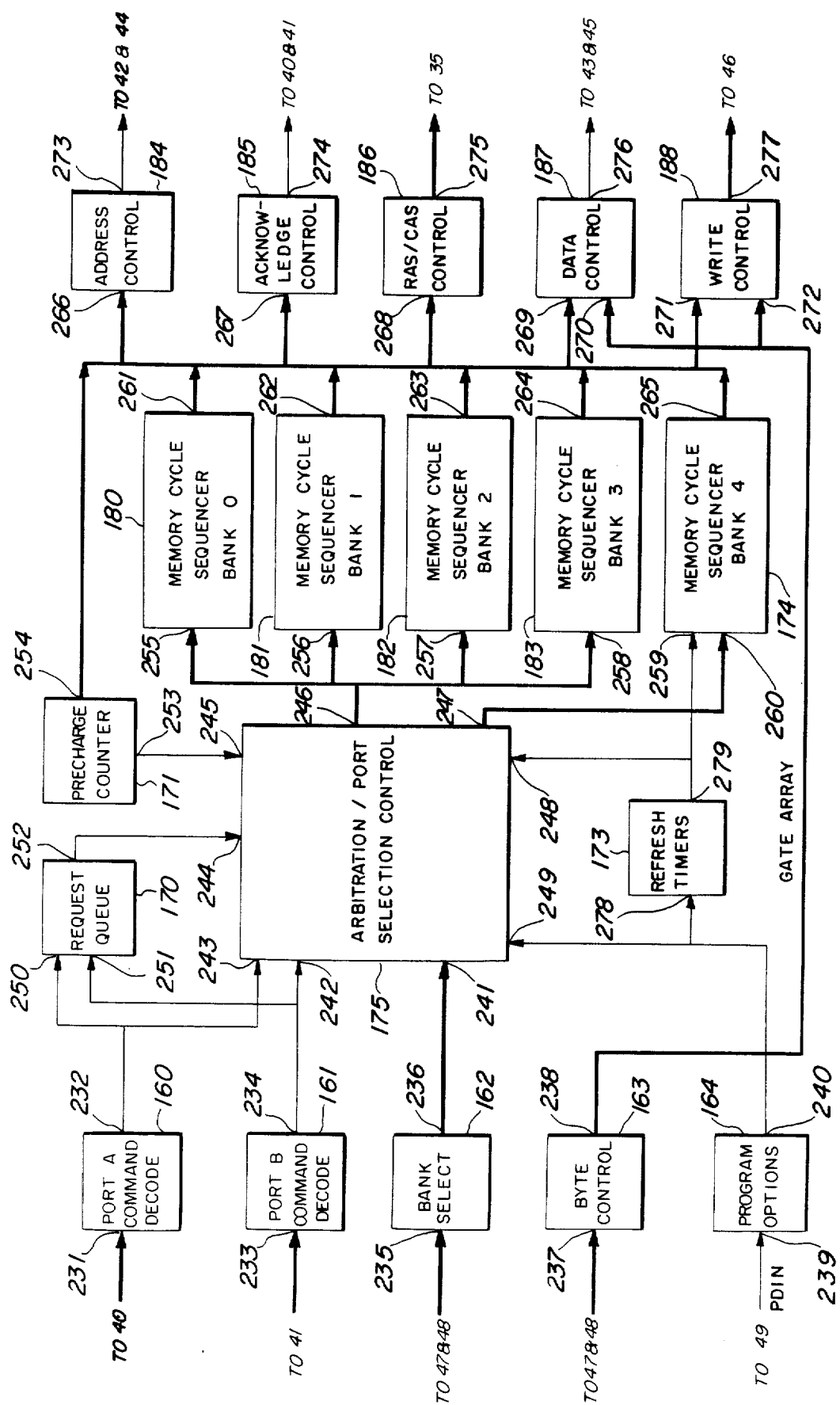
FIG. 7 is a block diagram representation of the dual port memory controller gate array shown in FIG. 1.

FIG. 7 sets forth a block diagram representation of gate array 10 shown in FIG. 1. A port A command decode 160 includes an input 231 coupled to input 40 of gate array 10 and an output 232. A port B command decode 161 includes an input 233 coupled to input 41 of gate array 10 and an output 234. A bank select circuit 162 includes an input 235 coupled to inputs 47 and 48 of gate array 10. and an output 236. A byte control 163 includes an input 237 coupled to inputs 47 and 48 of gate array 10 and an output 238. A system options circuit 164 includes an input 239 coupled to input 49 of gate array 10 and an output 240. An arbitration/port selection control 175 includes an input 243 coupled to output 232, an input 242 coupled to output 234, an input 241 coupled to output 236, and an input 249 coupled to output 240. Arbitration/port selection control 175 further includes inputs 244, 245 and 248 together with outputs 246 and 247. A refresh timer 173 includes an input 278 coupled to output 240 and an output 279 coupled to input 248. A request queue 170 includes an input 250 coupled to output 232, an input 251 coupled to output 234 and an output 252 coupled to input 244. A precharge counter 171 includes an input 254 and an output 253 coupled to input 245 of arbitration/port selection control 175. A quartet of memory cycle sequencers 180, 181, 182 and 183 define respective inputs 255, 256, 257 and 258 commonly coupled to output 246. Memory cycle sequencers 180 through 183 further define respective outputs 261 through 264 respectively which are commonly coupled to input 254 of precharge counter 171. A refresh cycle sequencer 174 includes an input 260 coupled to output 247, an input 259 coupled to output 279, an an output 265 coupled to input 254 of precharge counter 171.

An address control 184 includes an input 266 coupled to outputs 261 through 265 and an output 273 coupled to outputs 42 and 44 of gate array 10. An acknowledge control 185 includes an input 267 coupled to outputs 261 through 265 and an output 274 coupled to outputs 40 and 41 of gate array 10. A RAS/CAS control 186 includes an input 268 coupled to outputs 261 through 265 and an output 275 coupled to outut 35 of gate array 10. A data control 187 includes an input 269 coupled to outputs 261 through 265, an input 270 coupled to output 238 of byte control 163, and an output 276 coupled to outputs 43 and 45 of gate array 10. A write control 188 includes an input 271 coupled to output 261 through 265, an input 272 coupled to output 238 of byte control 163, and an output 277 coupled to output 46 of gate array 10.

In operation, port A command decode 160 receives the read/write signals from processor 17 (port A) and determines from the applied signal whether a memory request in being made by the processor. In the event the port A request circuit determines that a memory request is being made by processor 17, it produces a signal indicative of the request which is applied to input 243 of arbitration/port selection control 175. In accordance with the invention, the port A request is commonly coupled to input 250 of request queue circuit 170. Similarly, port B command decode 161 is coupled to processor 18 (port B) and receives similar read/write signals from port B processor 18. In similar fashion to port A command decode 160, port B command decode 161 determines whether a memory request is being made by processor 18. In the event a request is being made, port B command decode 161 applies an indicative signal to input 242 of arbitration/port selection control 175 and to input 251 of request queue 170.

Bank select 162 receives the address signals from processor A (17) and processor B (18) through inputs 47 and 48 of gate array 10 and examines the lower address lines of ports A and B to determine which bank of memory a memory request is directed to. In accordance with conventional computing systems, the address signal applied to address bus inputs 47 and 48 of gate array 10 comprises a plurality of binary words organized to provide information indicative of the selected one of banks 11, 12, 13 and 14 (seen in FIG. 1) within memory 16 together with the specific address within the selected bank to uniquely indentify the portion of memory 16 to which memory access is requested. Accordingly, bank select 162 initially examines the request at the appropriate portion thereof which permits a determination as to which memory bank is the subject of the request for access. In response to the determination of the appropriate bank, bank select 162 produces a bank select signal which is coupled to input 241 of arbitration/port selection control 175 to identify the selected bank.

Byte control 163 is coupled to processors 17 and 18 and is operative to determine which bytes within the memory address for which access is requested will be active during the transfer of information to or from the memory. In accordance with conventional computing techniques, only those portions of the stored information within the memory address which are to be changed will be active during the transfer of information to or from memory 16. Byte control 163 upon determination of the bytes which will be active during the transfer produces an output comprising an internal byte enable signal which is coupled to data control 187 and write control 188.

system options circuit 164 is coupled to the initialization portion of the host computer (not shown) which provides initialization information as to the processor types utilized for processors 17 and 18 as well as other operating parameter such as the number of wait states and the refresh interval operative upon memory 16. The primary function of system options circuit 164 is to provide a conversion of the serially configured system options information applied to input terminal 239 to a parallel configured information signal at output 240. The use of serial to parallel conversion within system options 164 is primarily utilized to reduce the number of external connections required to the operating environment of gate array 10 (seen in FIG. 1). Request queue circuit 170 receives the memory access requests generated by port A and port B command decode circuits 160 and 161 respectively and places them in a queue in the event that the memory access requests cannot be immediately serviced. As mentioned above, the present invention dual port memory controller resolves and prioritizes simultaneous requests for access to memory 16. Such simultaneous requests may, for example, result in the event one processor is currently doing a memory cycle at the time the other processor request is presented or in the event a refresh cycle is operative upon memory 16 at the time the memory request is presented. In accordance with the invention, the requests are initially queued within request queue 170 during the time arbitration and port selection control 175 is determining whether the request may be granted. In the event a request is granted the queued request is deleted from request queue 170. In the event the request cannot be granted, the queued request remains within request queue 170.

Precharge counter 171 includes a conventional bank of counters for each of banks 11 through 14 within memory 16 (seen in FIG. 1). The counters (not shown) are reset upon the completion of each memory cycle with the associated bank and are incremented by successive system clock pulses in accordance with the precharge setting provided by system options 164 during initialization as described above. The function of precharge counter circuit 171 is to inhibit the initiation of a new memory cycle in the same bank as the memory cycle until a predetermined time period has elapsed. This time period which is selected in accordance with the characteristics of the memory mechanism utilized in memory 16 is referred as the RAS precharge time. Once the counters within precharge counter 171 have counted the appropriate number of clock cycles, the inhibit signal is removed from input 245 of arbitration/port selection control 175 to permit the granting of the next memory cycle to the bank in questions.

Refresh timer 173 includes a timing circuit which periodically generates refresh requests to refresh the dynamic memory within memory 16. The use of refresh timer 173 and its construction comprises an important aspect of the present invention in that individual refresh of banks 11 through 14 within memory 16 is undertaken in a staggered sequential timing thereby eliminating the simultaneous operation of refresh cycles upon all of the banks within memory 16. This staggered operation assures that the RAS and CAS operations will not occur simultaneously. This latter effect is particularly beneficial in eliminating the production of undesired noise within the system.

Arbitration/port selection control 175 comprises a dedicated system gate array which in accordance with the invention is optionable but not programmable that is to say, the system is not controlled by a processor. Accordingly, the basic decision functions as set forth in the flow diagrams of FIGS. 2 through 6 inclusive, is carried forward to determine the priorization of conflicting requests for access to memory 16. A substantial advantage of the present invention system in resolving or arbitrating between conflicting requests for memory access is realized by the use of a dedicated system system with the particular processor being used. As is known, system systems of the type used in conventional memory controllers are configured to accept many types of processors. The capability of accepting different processors results in lengthier decision processes. In contrast, dedicated system arrays carry forward the decision process in substantially shorter time intervals and do not sacrifice time for accommodation of different processors. Accordingly, arbitration/port selection control 175 arbitrates between port A and port B requests, queued port A and port B requests and refresh requests to grant access to memory 16 in accordance with the process set forth in the flow diagrams of FIGS. 2 through 6, inclusive. In addition, because the staggered refresh system of the present invention results in refresh requests occurring for one bank at a time, arbitration/port selection control 175 can permit a memory cycle or access to occur in one bank while a refresh cycle is occurring in another bank. This is extremely advantageous in that system noise is reduced due to the switching of smaller RAS and CAS currents. In systems using simultaneous refresh of all memory banks, high RAS and CAS currents are switched causing a general increase in noise within the memory and associated system portion. In addition, because only one fourth of memory 16 is rendered inaccessible by the refresh operation at any given time, the remaining portions may be accessed during refresh.

Memory cycle sequencers 180, 181, 182 and 183 are of identical construction and function and are individually operable upon memory banks 11, 12, 13 and 14 respectively of memory 16. The memory cycle sequencers control the timing of events within a memory cycle. In response to control signals from arbitration/port selection control 175 and the read or write select signal, the memory cycle sequencer produces a series of properly timed signals to perform a memory cycle. Apart from the foregoing described staggered refresh on the individual banks 11 through 14 of the present invention system, memory cycle sequencers 180 through 183 are constructed and operative in accordance with conventional memory cycle sequencer fabrication and produce the required control of the memory address strobing, the RAS and CAS signals, and the read/write signals operable to transfer information to or from the individual banks of memory 16.

Refresh cycle sequencer 174 is operative in response to the timing signal from refresh timer 173 which triggers the request to arbitration/port selection control 175 for the initiation of a refresh cycle. In response to the decision process set forth in FIGS. 2 through 6, inclusive, arbitration/port selection control 175 thereafter produces an enable signal which is applied to refresh cycle sequencer 174 causing it to initiate a refresh cycle on the memory banks of memory 16 in accordance with the above-described staggered refresh system. Refresh cycle sequencer 174 comprises a timing signal generating circuit which produces the required CAS and RAS signals in much the same manner as the foregoing described memory cycle sequencers 180 through 183. as mentioned above in connection with FIG. 6, refresh cycle sequencer 174 performs CAS operation prior to RAS operation.

Address control 184 is operative in response to the output signals of memory cycle sequencers 180 through 183 to control the external address buffers and multiplexers of the present invention system and select the appropriate address for application to the memory array. Address control 184 produces the required output signals necessary to gate the proper row or column addresses to the selected bank of memory 16 to which access is granted.

Acknowledge control 185 responds to memory cycle sequencers 180 through 183 to determine the completion of a memory cycle and produce an output signal which is coupled to terminals 40 and 41 of gate array 10 which in turn are coupled to processor A (17) or processor B (18) to indicate the completion of the memory cycle.

RAS/CAS control 186 responds to memory cycle sequencers 180 through 183 or refresh cycle sequencer 174 to produce the appropriate RAS and CAS signals in proper synchronization to the system clock signals for effective strobing of the memory during the memory or refresh cycles. The output from RAS/CAS control 186 comprises the strobe signals which strobes in the row address or column address of the address within memory 16 to which or from which information is to be transferred.

Data control 187 responds to byte control 163 and memory cycle sequencers 180 through 183 to control the number of bytes within the selected address of memory 16 which are to be activated. In accordance with the present invention system, byte control 163 provides information to data control 187 indicating the byte to be activated while memory cycle sequencers 180 through 183 indicate the timing applicable to the transfer of the information byte to the memory address. Data control 187 produces four data enable signals which are applied to data buffers 60 and 80 (seen in FIG. 1).

Write control 188 responds to byte control 163 to select the byte within the selected memory address to which information will be written. The timing of information transfer is controlled by the signals provided by memory cycle sequencers 180 through 183. Write control 188 produces a write signal in the event information is to be transferred to memory 16. In the absence of a write signal from write control 188, the system will initiate a read of the selected address within memory 16.

While particular embodiments of the invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention.

That which is claimed is:

1. A dual port memory controller for use in interfacing a pair of processors to a common memory having a plurality of memory banks each organized into row and column defined addresses, said dual port memory controller comprising:

RAS means for generating row address strobe signals;

CAS means for generating column address strobe signals;

refresh means for periodically refreshing said common memory, said refresh means operating upon each of said banks within said common memory in a staggered manner;

arbitration means coupled to said pair of processors having logic means for granting either of said processors or said refresh means access to said common memory in accordance with a predetermined priority; and memory cycle sequencing means coupled to said RAS means and said CAS means and said arbitration means for controlling the operation of said RAS means and CAS means upon said common memory.

2. A dual port memory controller as set forth in claim 1 wherein said arbitration means include means for simultaneously granting access to different ones of said memory banks of said common memory to one of said processors selected in accordance with said predetermined priority and to said refresh means.

3. A dual port memory controller as set forth in claim 2 wherein said arbitration means include queue means for temporarily storing a processor request and wherein each request for access by said processors is applied simultaneously to said arbitration means and said queue means.

4. A dual port memory controller as set forth in claim 3 wherein said refresh means includes refresh cycle sequencing means coupled to said RAS means and said CAS means and said arbitration means for controlling the operation of said RAS means and CAS means upon said common memory and wherein said CAS means are operative upon said memory prior to operation of said RAS means upon said memory.

5. A dual port memory controller as set forth in claim 4 wherein said arbitration means includes means determing the temporary storage of a processor request within said queue means and selecting a predetermined one of said pair of processors for access to said memory in the absence of a stored processor request within said queue means.

6. A dual port memory controller as set forth in claim 5 wherein said arbitration means include means removing said temporarily stored processor requests from said queue means once access to said common memory of said processor request has been granted.

7. For use in controlling the access of a first and a second processor to a common memory having a plurality of memory banks each organized into a plurality of row and column defined addresses, a dual port memory controller comprising:

RAS means for generating row address strobe signals during memory cycling;

CAS means for generating column address strobe signals during memory cycling;

an arbitration/port selection control having a logic array for controlling the access to said common memory of said first and second processors in accordance with a predetermined priority;

a first port command decode circuit coupled to said first processor and said arbitration means for determing the presence of a memory access request from said first processor and coupling said request to said arbitration means;

a second port command decode circuit coupled to said second processor and said arbitration means for determining the presence of a memory access request from said second processor and coupling said request to said arbitration means;

queue means for temporarily storing a processor memory access request;

a plurality of memory cycle sequencers each coupled to said arbitration means for providing a plurality of timing controls of signals produced by said arbitration means during memory cycles, said memory sequencers applying said column address strobe signals to said common memory prior to application of said row address strobe signals;

refresh means coupled to said arbitration means for periodically producing a plurality of memory refresh signals;

a refresh cycle sequencer coupled to said refresh means and said common memory for providing a plurality of timing controls of signals produced by said arbitration means during memory refresh cycles said refresh cycle sequencer applying said column address strobe signals to said common memory prior to application of said row address strobe signals; and means providing staggered operation of said refresh means upon said memory banks in said common memory.

8. A dual port memory controller as set forth in claim 7 wherein said refresh cycle sequencer and said memory cycle sequencer may be simultaneously operative upon different ones of said plurality of memory banks within said common memory.

* * * * *